United States Patent [19]
Cunningham et al.

[11] Patent Number: 6,028,428
[45] Date of Patent: Feb. 22, 2000

[54] MULTIBAND SELECTIVE RF PULSE CONSTRUCTION FOR NMR MEASUREMENT SEQUENCES

[76] Inventors: Charles H. Cunningham, 55 Riverdale Ave., Toronto On, Canada, M4K 1C2; Michael L. Wood, 56 Glenellen Dr. East, Etobicoke On, Canada, M8Y 2G8

[21] Appl. No.: 09/057,839

[22] Filed: Apr. 9, 1998

[51] Int. Cl.[7] .................................................. G01V 3/00
[52] U.S. Cl. ......................... 324/314; 324/309; 324/307; 600/410
[58] Field of Search .................................... 324/314, 309, 324/307, 312; 600/410

[56] References Cited

U.S. PATENT DOCUMENTS 4,940,940  7/1990  Le Roux ............................ 324/309

*Primary Examiner*—Christine Oda
*Assistant Examiner*—Brij B. Shrivastav
*Attorney, Agent, or Firm*—Barry E. Sammons; Christian G. Cabou; Phyllis Y. Price

[57] ABSTRACT

A multiband RF pulse is produced using the SLR method. A single-band RF pulse is produced and employed to determine correction factors. The SLR polynomial coefficients for each excited band are calculated and corrected, and then combined to form a composite SLR polynomial from which the multiband RF pulse is produced.

6 Claims, 3 Drawing Sheets

MULTIBAND SELECTIVE RF PULSE CONSTRUCTION FOR NMR MEASUREMENT SEQUENCES

BACKGROUND OF THE INVENTION

The field of the invention is nuclear magnetic resonance methods and systems. More particularly, the invention relates to the design of RF pulses used in nuclear magnetic resonance ("NMR") spectroscopy and magnetic resonance imaging ("MRI") pulse sequences.

When a substance such as human tissue is subjected to a uniform magnetic field (polarizing field $B_0$), the individual magnetic moments of the spins in the tissue attempt to align with this polarizing field, and the component of net magnetization perpendicular to the polarizing field precess about it at the characteristic Larmor frequency. If the substance, or tissue, is subjected to an RF magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the RF excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

There are numerous pulse sequences used in MRI and in NMR spectroscopy. These pulse sequences use at least one, and usually more than one, RF pulse near the Larmor frequency. In addition to the RF excitation pulse mentioned above, such RF excitation pulses may, for example, invert spin magnetization, saturate spin magnetization, stabilize spin magnetization or refocus spin magnetization. When used in combination with a magnetic field gradient, the RF pulses selectively affect spin magnetization over a specific frequency range which corresponds to a specific location within the subject being scanned. Such "selective" RF pulses are thus specified by the degree to which they tip magnetization ("flip-angle") over a range of frequencies.

In U.S. Pat. No. 4,940,940 a method is disclosed for designing RF pulses that will produce a desired flip-angle over a specified frequency range. The disclosure of this patent is hereby incorporated by reference. This method, known in the art as the "SLR" method, starts with the desired frequency domain pulse profile (for example, a 90° flip-angle over a specified slice thickness/frequency range) and calculates the amplitude and phase of an RF pulse, that when played out over time, will produce the desired result. These calculations involve the approximation of the desired frequency domain pulse profile with two high order polynomials A and B which can then be transformed directly into an RF pulse that is "played out" on an NMR system. The step of producing the polynomials A and B employs a Remez (Park-McClellan) algorithm that is executed in an iterative process. To calculate the necessary A and B polynomials (hereinafter referred to as the "SLR polynomials") this iterative process is performed until the desired frequency domain pulse profile is approximated to a specified degree of accuracy.

In MR imaging, almost every scan involves the construction of images of multiple slices. This is commonly done with conventional multi-slice imaging, in which the actions necessary to acquire the data from each slice are interleaved within a single repetition time (TR). Alternatively, when the number of desired slices is large, it is possible to perform 3D Fourier imaging, in which the through-slice direction is phase encoded. When the desired number of slices is small, but conventional multi-slice imaging requires multiple passes, either because of a short TR or because data acquisition for a particular slice is long (e.g. echo planar or spiral acquisition), an alternative to the two standard methods described above provides a significant signal to noise improvement. This method uses "multiband excitation" in which multiple bands of magnetization are excited simultaneously with a single radiofrequency (RF) pulse. Imaging methods that make use of multiband RF pulses includes POMP, Hadamard encoding, and wavelet encoding.

Conventionally, the RF pulses for a multiband method are made by summing the separate RF pulses needed to excite each slice separately. There are many methods for designing the separate RF pulses, including the SLR method described in the above-cited patent. This method of multiband RF pulse construction works well only when the excited slices are separated by an adequate gap. The "composite" RF pulse must excite regions separated by a gap in order to avoid slice interference when the slices are close together. Another problem related to multiband excitation stems from a phase error that depends on the position of the excited band. This so-called band-position phase error arises when a slice is excited off-resonance by applying a phase ramp to the RF pulse envelope. A phase ramp occurs when each sample of the RF pulse envelope is multiplied by a complex number of unit magnitude and a phase that depends linearly on the sample index. This phase error can be corrected by multiplying each RF pulse sample by a complex number whose phase is the negative of the band-position phase error. The actual phase correction depends on many factors related to the particular RF pulse.

SUMMARY OF THE INVENTION

The present invention is a method for producing a multiband RF pulse for use in MR imaging and MR spectroscopy. More specifically, the method includes producing a beta-polynomial for a single slice; producing a corresponding alpha-polynomial; inverse SLR transforming the two polynomials to produce a single-band RF pulse which excites a single slice; measuring the isodelay produced by the single-band RF pulse; producing a separate beta-polynomial for each of the multiband slices; correcting each separate beta-polynomial for the measured isodelay; summing the corrected beta-polynomials; producing a multiband alpha-polynomial for the summed beta-polynomials; and producing the multiband RF pulse by inverse SLR transforming the summed beta-polynomial and multiband alpha polynomial.

A general object of the invention is to produce a multiband RF pulse which accurately excites multiple bands of magnetization simultaneously. Using the invented method the phases of the separately excited bands can be controlled accurately. Also, there is no interference between adjacent slices, thus enabling the slices to be positioned adjacent each other with no gap.

GENERAL DESCRIPTION OF THE INVENTION

Figure 1:
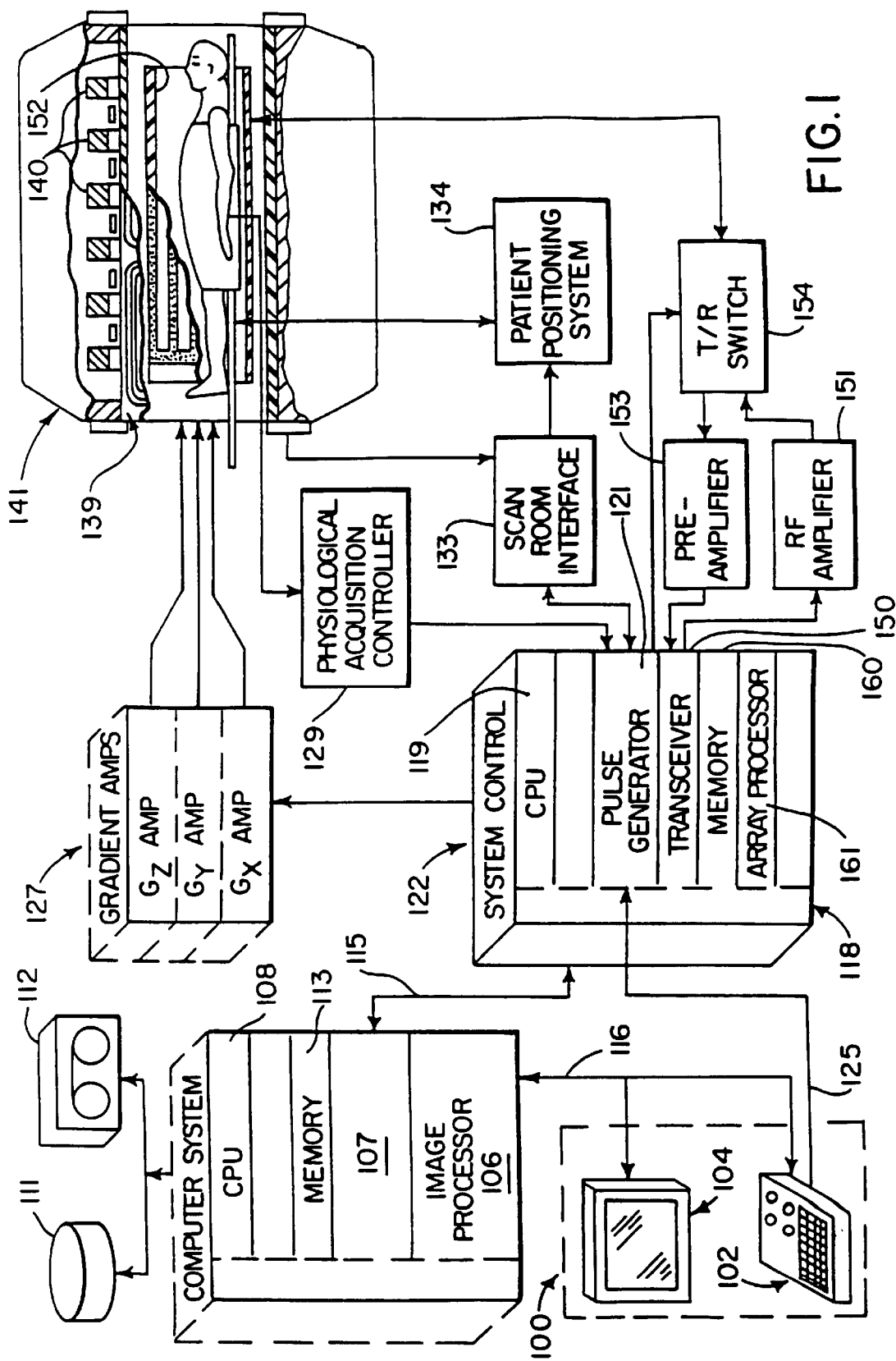
FIG. 1 is a block diagram of an MRI system which employs the present invention.

Selective excitation restricts the tipping or excitation of magnetization by an RF pulse to a certain region, usually a single band. In this disclosure, a "band" denotes a region in which selective excitation is intended to create transverse magnetization with uniform magnitude and phase. The term "slice" also refers to a region affected by selective excitation. However, "slice" refers to the physical region or the spatial distribution of magnetization represented by an MR image or spectrum. A slice can arise directly by selective excitation or indirectly through some combination of data. A plot of the magnitude and phase of magnetization as a function of position after excitation is referred to as an "excitation profile". Similarly, a plot of the magnitude and phase of magnetization through the thickness of a slice is called a slice profile.

There are many ways to design RF pulses, including the Shinnar-Le Roux (SLR) transform. The SLR transform provides a mapping between the sampled RF pulse waveform, $B_1(t)$, and two polynomials, $A_n(z)$ and $B_n(z)$:

$$B_1(t) \overset{SLR}{\Leftrightarrow} (A_n(z), B_n(z)) \qquad (1)$$

where z is a complex number of unit magnitude. The SLR transform is useful, because the excitation profile of RF(t) is well approximated by the Fourier transform of the coefficients of $B_n(z)$. This property allows the use of digital filter design methods to derive the coefficients of $B_n(z)$. The polynomial, $A_n(z)$, is derived from $B_n(z)$ and then the inverse SLR transform is applied to retrieve the RF pulse, $B_1(t)$. The present invention makes use of the SLR transform in designing RF pulses to excite multiple bands simultaneously.

The simultaneous excitation of bands of magnetization in different spatial locations is prone to two special problems. The first is a phase error that is proportional to the position of the excited band from the system isocenter and second is interference between excited bands. The phase error occurs even when a single band is excited, but in this case it is usually inconsequential. The origin of this phase error is in the mechanism through which a band that is not in the isocenter of the MR coordinate system is excited. Hence, this phase error is denoted "band-position phase error." To excite such an off-center band, the sequence of complex numbers representing the RF pulse envelope is multiplied by a phase ramp. That is, each sample of the RF pulse envelope is multiplied by a complex number of unit magnitude and a phase that depends linearly on the sample index, as follows:

$$RF_m \rightarrow RF_m \exp\{i\gamma G \Delta x \Delta t(m-1)\} \qquad (2)$$

where $RF_m$ is the mth RF pulse sample, $\gamma$ is the gyromagnetic ratio, G is the strength of the magnetic-field gradient applied during the RF pulse, $\Delta x$ is the distance of the band from the magnet isocenter, $\Delta t$ is the sampling interval of the RF pulse, and m is the sample index.

Figure 3:
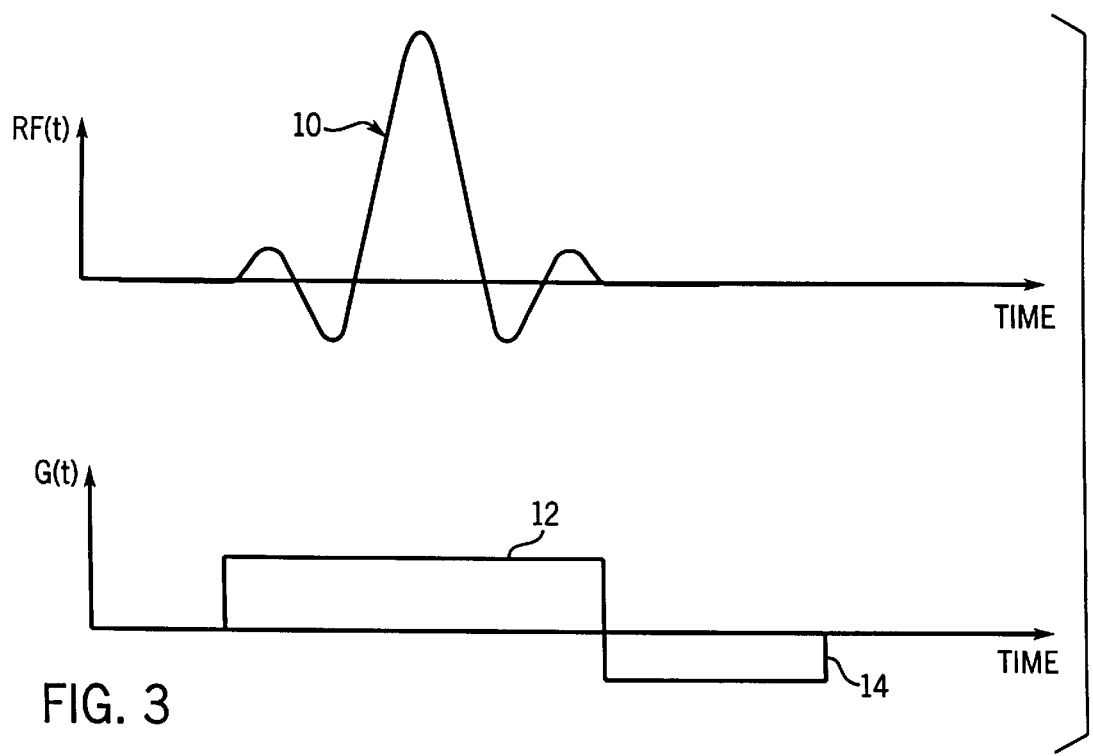
FIG. 3 is a graphic representation of a selective RF excitation pulse and associated gradient pulse.

The band-position phase error described above can be corrected by multiplying each RF pulse sample by a complex number of unit amplitude and a phase that is the negative of the actual phase error. The phase error has been shown to be:

$$\Phi_{sw} = (1-\beta)\gamma G \Delta x t_p \qquad (3)$$

where $t_p$ is the length of the RF pulse and $\beta$ is the ratio of the area of the refocusing gradient lobe applied after the RF pulse to the area of the gradient lobe applied during the RF pulse. This is shown in FIG. 3 where the RF pulse 10 is applied concurrently with a slice select gradient lobe 12, and a refocusing lobe 14 is applied thereafter. For the present invention, the parameter $\beta$ is chosen such that the phase of the magnetization across the excitation profile is minimized. The rationale is that the minimum phase condition maximizes the signal.

The second problem with multiband excitation is interference between the excited bands. The present invention is a method for producing a multiband RF pulse using the SLR transform which solves the problem of band-position phase error and the interference between excited bands. First, a $B_n(z)$ polynomial corresponding to one slice is designed for the SLR method. There are many possible methods to design the $B_n(z)$ polynomial. One way is to use a digital filter design tool, such as the Parks-McLellan (PM) method described in "*Theory and Application of Digital Signal Processing*" by L. R. Rabiner and B. Gold, Prentice-Hall, 1975. Inputs to the PM method are the bandwidth, fractional transition width, and ripple amplitude in the pass band and stop band of a low-pass filter. In the context of this invention, the inputs to the PM method are the parameters describing the features of a single band to be excited. The output is a sequence of complex numbers whose Fourier transform approximates the desired filter. In this case, the output is a sequence of coefficients of the $B_n(z)$ polynomial. Then the magnitude of the $A_n(z)$ polynomial is determined by the following relationship between $A_n(z)$ and $B_n(z)$ in the SLR transform:

$$|A_n(z)| = \sqrt{1 - B_n(z)B_n^*(z)} \qquad (4)$$

The minimum phase $A_n(z)$ polynomial is selected from among many alternatives. This implies that the log-magnitude and phase of $A_n(z)$ are a Hilbert transform pair, giving $$A_n(z) = |A_n(z)| \exp[iH\{\log|A_n(z)|\}] \qquad (5)$$

where "H" represents a Hilbert transform.

After $A_n(z)$ and $B_n(z)$ have been determined for the single band, the inverse SLR transform is used to construct an RF pulse that excites a single band. This test RF pulse is intended only for analysis to provide the above parameter $\beta$.

The optimal value of the parameter $\beta$ is determined by computer simulation, although experimental measurements using an MR system can also provide the required information. The computer simulation solves the phenomenological Bloch equation (called a Bloch-equation simulation) to calculate the spatial distribution of magnetization vectors after the test RF pulse is applied. Referring to FIG. 3, this is accomplished by varying the area of the refocusing gradient lobe 14 applied after the test RF pulse 10 in the simulation. The optimum $\beta$ minimizes the phase of the magnetization across the slice profile. Typically, for a symmetrical RF pulse, as is shown in FIG. 3, the optimal value for $\beta$ is around 0.51.

The $B_n(z)$ polynomial corresponding to each excitation band is then constructed using the above described PM method.

$$B_n(z) = \sum_{m=1}^{n} b_m z^{-(m-1)}$$

The $B_n(z)$ coefficients for each of the excitation bands is then multiplied with a phase ramp to correct for the band-position phase error, using Equation 3 and the particular value of $\beta$ determined for the single-band test RF pulse:

$$b_m \rightarrow b_m \exp\{i\gamma G \Delta x \Delta t(m-1) + (\beta-1)i\gamma G \Delta x t_p\} \quad (6)$$

where $b_m$ is the coefficient that multiplies the $z^{-(m-1)}$ term in the $B_n(z)$ polynomial, and $\Delta x$ is the distance of the particular excitation band from the system isocenter, $\gamma$ is the gyromagnetic constant, G is the slice select gradient amplitude, and $t_p$ is the duration of the RF pulse. These $B_n(z)$ coefficients for each of the multiple bands are summed to create the multiband $B_n(z)$:

$$b_m^{multiband} = \sum_{j=1}^{J} \exp[i\Phi_j] b_{m,j} \quad (7)$$

where $b_{m,j}$ is the coefficient that multiplies the $z^{-(m-1)}$ term in the $B_n(z)$ polynomial corresponding to the jth of J separate excitation bands excited simultaneously with phase $\Phi_j$. The phase $\Phi_j$ is the phase of the jth band of desired magnetization relative to the Larmor-frequency rotating frame. Next, the minimum-phase $A_n(z)$ polynomial is derived from this composite $B_n(z)$ using Equation 4 and 5, after which the inverse SLR transform yields the multiband RF pulse.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 or other archival device for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. These commands include the location, thickness and flip-angle corresponding to any RF pulses that are to be employed in the pulse sequence.

The pulse generator module 121 operates the system components to carry out the desired scan sequence. It produces data which indicate the timing, strength and shape of the RF pulses which are to be produced, and the timing and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to inverse Fourier transform the data into an array of image data. These image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104.

Figure 2:
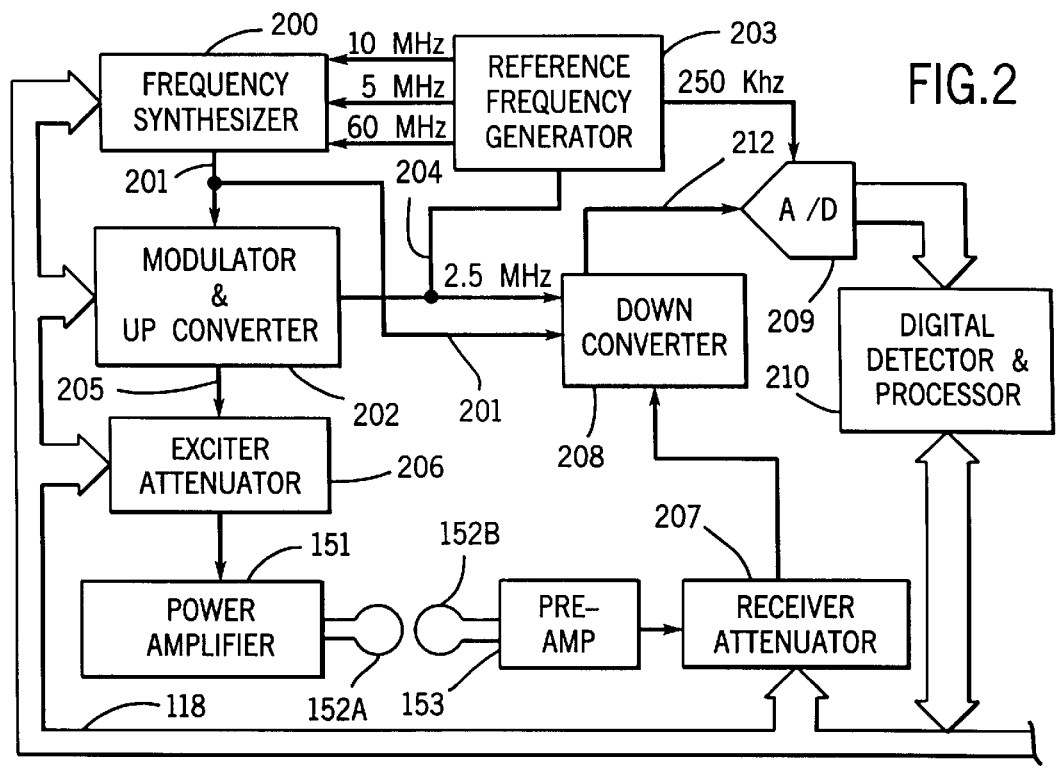
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The RF carrier is applied to a modulator and up converter 202 where its amplitude is modulated in response to a signal R(t) also received from the pulse generator module 121. The signal R(t) defines the envelope of the RF excitation pulse to be produced, and it is produced in the module 121 by sequentially reading out a series of stored digital values. It is the calculation of these stored digital values R(t) that is the subject of this invention.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHZ reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

In the preferred embodiment of the present invention the desired RF pulse prescribed by the operator is conveyed from the console 100 to the system control 122. The prescription is in the form of a desired flip-angle at specified locations. In response, the CPU module 119 executes a program according to the method of the present invention to calculate the values R(t) which are used by the pulse generator 121 and transceiver 150 to produce the desired RF pulse envelope.

Figure 4:
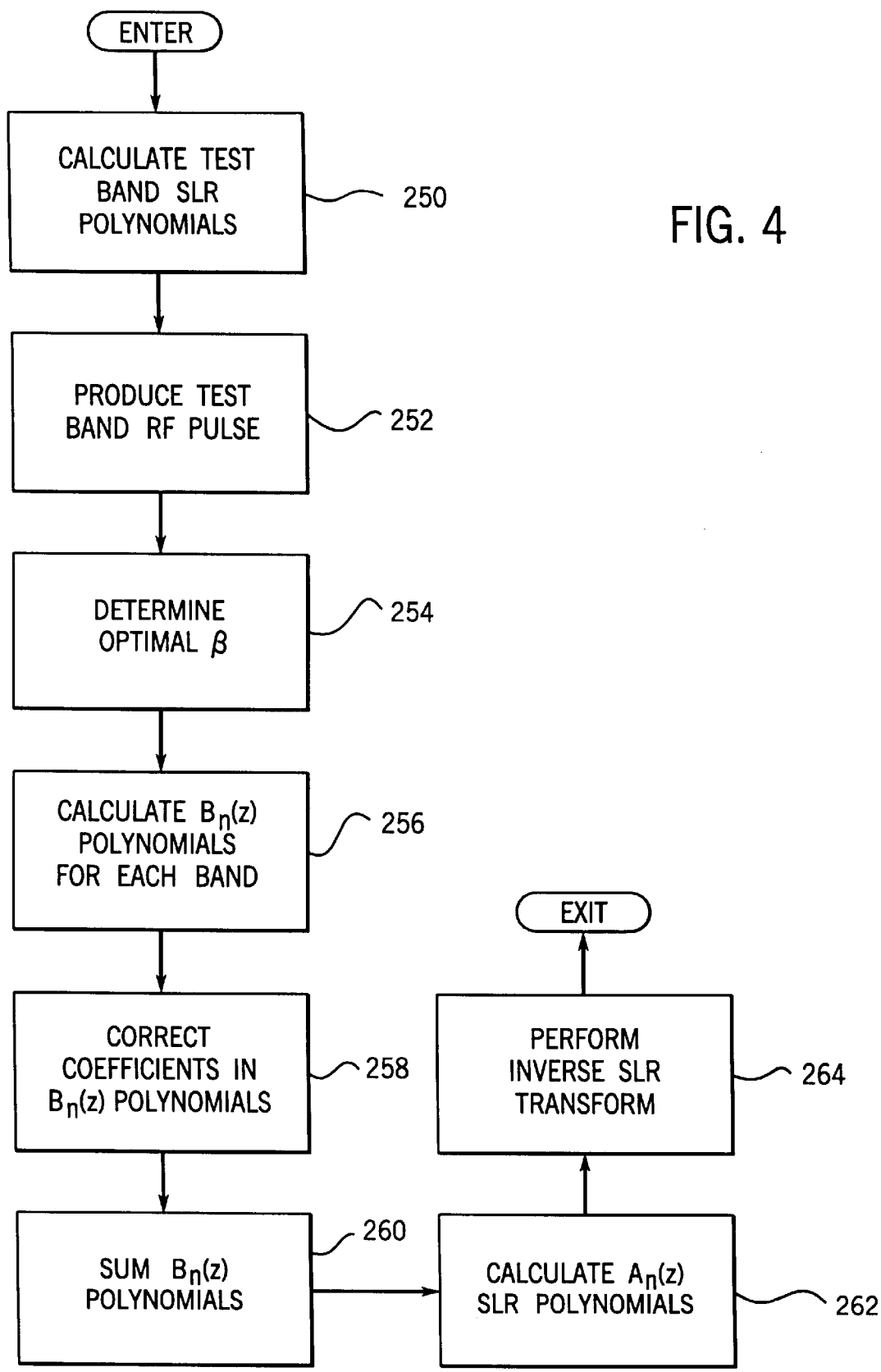
FIG. 4 is a flow chart illustrating the steps of the preferred method for practicing the invention.

A flow chart of a preferred embodiment of the invention is shown in FIG. 4. As indicated at process block 250, the first step is to calculate the $B_n(z)$ and $A_n(z)$ SLR polynomials for a test band. This is done using the Parks-McLennan method described above and the inputs are the parameters which define a single band in the desired multiband RF excitation pulse. As described above, the minimum phase criteria is selected to produce the $A_n(z)$ polynomial for the test band. The test band rf pulse is then produced as indicated at process block 252 by performing an inverse SLR transform on the test band $B_n(z)$ and $A_n(z)$ polynomials.

The test band RF pulse is then used to determine the optimum value of correcting parameter β as indicated at process block 254. This can be accomplished as discussed above using computer simulation or it can be accomplished using a pulse sequence such as that in FIG. 3 in the MRI system of FIGS. 1 and 2. In either case, this is accomplished by applying the test band RF pulse 10 with the slice select gradient lobe 12 and rephasing the resulting transverse magnetization with the gradient lobe 14. The measurement is made through a range of gradient lobe 14 values, and the value which produces the transverse magnetization with the least phase dispersion is selected. Then the optimum correction parameter β is the ratio of the area of the slice select gradient lobe 14 to the area of slice select gradient lobe 12.

The production of the multiband RF excitation begins as indicated at process block 256 by calculating the $B_n(z)$ polynomials for each separate band therein. This is accomplished using the Parks-McLennan method and input parameters for each separate band. The coefficients in each set of $B_n(z)$ SLR polynomials are then corrected as indicated at process block 258. This is accomplished using the value of β and the above-described equation (6). The separate, corrected $B_n(z)$ SLR polynomials are then summed together as indicated at process block 260 to form a composite $B_n(z)$ SLR polynomial according to the above described equation (7).

Using the composite SLR $B_n(z)$ polynomial and the minimum phase criteria, the composite $A_n(z)$ SLR polynomial is calculated at process block 262. The final multiband RF pulse is then produced at process block 264 by performing an inverse SLR transform using the composite SLR polynomials $B_n(z)$ and $A_n(z)$.

We claim:

1. A method for producing a multiband RF pulse that excites magnetization in a plurality of bands, the steps comprising:

a) determining a correction parameter β for a single band;

b) calculating a $B_n(z)$ polynomial for each band;

c) correcting coefficients in each of the $B_n(z)$ polynomials using the correction parameter β;

d) summing the $B_n(z)$ polynomials to form a composite $B_n(z)$ polynomial;

e) calculating a composite $A_n(z)$ polynomial using the composite $B_n(z)$ polynomial; and f) performing an SLR transform using the $A_n(z)$ and $B_n(z)$ composite polynomials to produce the multiband RF pulse.

2. The method as recited in claim 1 in which step a) is performed by:

creating an RF test pulse for said single band; and determining a slice select gradient which will produce a minimum phase dispersion in transverse magnetization produced by the RF test pulse.

3. The method as recited in claim 1 in which step c) is performed using the formula $$b_m \to b_m \exp\{i\gamma G\Delta x \Delta t(m-1)\ i\gamma G\Delta x t_p\},$$

where:

$b_m$ is a coefficient that multiplies a $z^{-(m-1)}$ term in the $B_n(z)$ polynomial, $\Delta x$ is the distance of the band from system isocenter, γ is the gyromagnetic constant G is the amplitude of a slice select gradient to be used with the multiband RF pulse, $t_p$ is the duration of the multiband RF pulse, and β is the correction parameter.

4. The method as recited in claim 1 in which step d) is performed using the formula $$b_m^{multiband} = \sum_{j=1}^{J} \exp[i\Phi_j] b_{m,j}$$

where: $b_{m,j}$ is a coefficient that multiplies a $z^{-(m-1)}$ term in the $B_n(z)$ polynomials, corresponding to the jth of J bands excited simultaneously with phase $\Phi_j$.

5. In an MRI system the combination comprising:

an operator console for entering parameters that define a scan which includes the excitation of magnetization in a plurality of bands;

means responsive to entered parameters for determining a correction parameter $\beta$ for one of the bands;

means responsive to entered parameters for calculating a $B_n(z)$ polynomial for each of the bands;

means for correcting the coefficients in each of the $B_n(z)$ polynomials using the correction parameter $\beta$;

means for summing the corrected $B_n(z)$ polynomials to produce a single composite $B_n(z)$ polynomial;

means for calculating a composite $A_n(z)$ polynomial using the composite $B_n(z)$ polynomial;

means for performing an SLR transform using the $A_n(z)$ and $B_n(z)$ composite polynomials to define a multiband RF pulse; and means for using the defined multiband RF pulse to produce RF pulses during a scan which produce excited magnetization in a plurality of bands in a subject positioned in the MRI system.

6. The MRI system as recited in claim 5 in which the means for determining a correction parameter $\beta$ includes:

means for creating an RF test pulse for exciting magnetization in said one band;

means for performing a pulse sequence using the RF test pulse and a slice select gradient pulse to determine an optimal slice select gradient which will produce a minimum phase dispersion in transverse magnetization produced by the RF test pulse; and means for calculating the correction parameter $\beta$ from the optimal slice select gradient pulse.

* * * * *